(12) United States Patent
Yang et al.

(10) Patent No.: US 10,151,978 B2
(45) Date of Patent: Dec. 11, 2018

(54) METHODS AND APPARATUSES FOR DIRECTED SELF-ASSEMBLY

(71) Applicant: Seagate Technology LLC, Cupertino, CA (US)

(72) Inventors: XiaoMin Yang, Livermore, CA (US); Shuaigang Xiao, Fremont, CA (US); Kim Y. Lee, Fremont, CA (US); David S. Kuo, Palo Alto, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 15/517,505

(22) PCT Filed: Nov. 18, 2014

(86) PCT No.: PCT/US2014/066228
§ 371 (c)(1),
(2) Date: Apr. 6, 2017

(87) PCT Pub. No.: WO2016/080972
PCT Pub. Date: May 26, 2016

(65) Prior Publication Data
US 2017/0307976 A1 Oct. 26, 2017

(51) Int. Cl.
G03F 7/11 (2006.01)
G03F 7/40 (2006.01)
(Continued)

(52) U.S. Cl.
CPC ............ *G03F 7/11* (2013.01); *B81C 1/00031* (2013.01); *C08L 53/00* (2013.01); *G03F 7/0002* (2013.01);
(Continued)

(58) Field of Classification Search
CPC . G03F 7/168; G03F 7/165; G03F 7/40; G03F 7/11; H01L 21/0274; C08L 53/00
(Continued)

(56) References Cited

U.S. PATENT DOCUMENTS 9,523,917 B2 * 12/2016 Ban ........................ C08F 293/00
9,587,063 B2 * 3/2017 Cakmak .............. C08F 290/068
(Continued)

OTHER PUBLICATIONS

KR issued "International Search Report" dated Aug. 12, 2015, for International Application No. PCT/US2014/066228; 3 pages.
(Continued)

Primary Examiner — Amanda C. Walke

(57) ABSTRACT

Provided herein is a method, including creating a first layer over a substrate, wherein the first layer is configured for directed self-assembly of a block copolymer thereover; creating a continuous second layer over the first layer by directed self-assembly of a block copolymer, wherein the second layer is also configured for directed self-assembly of a block copolymer thereover; and creating a third layer over the continuous second layer by directed self-assembly of a block copolymer. Also provided is an apparatus, comprising a continuous first layer comprising a thin film of a first, phase-separated block copolymer, wherein the first layer comprises a first chemoepitaxial template configured for directed self-assembly of a block copolymer thereon; and a second layer on the first layer, wherein the second layer comprises a thin film of a second, phase-separated block copolymer.

16 Claims, 8 Drawing Sheets

Figure 1:
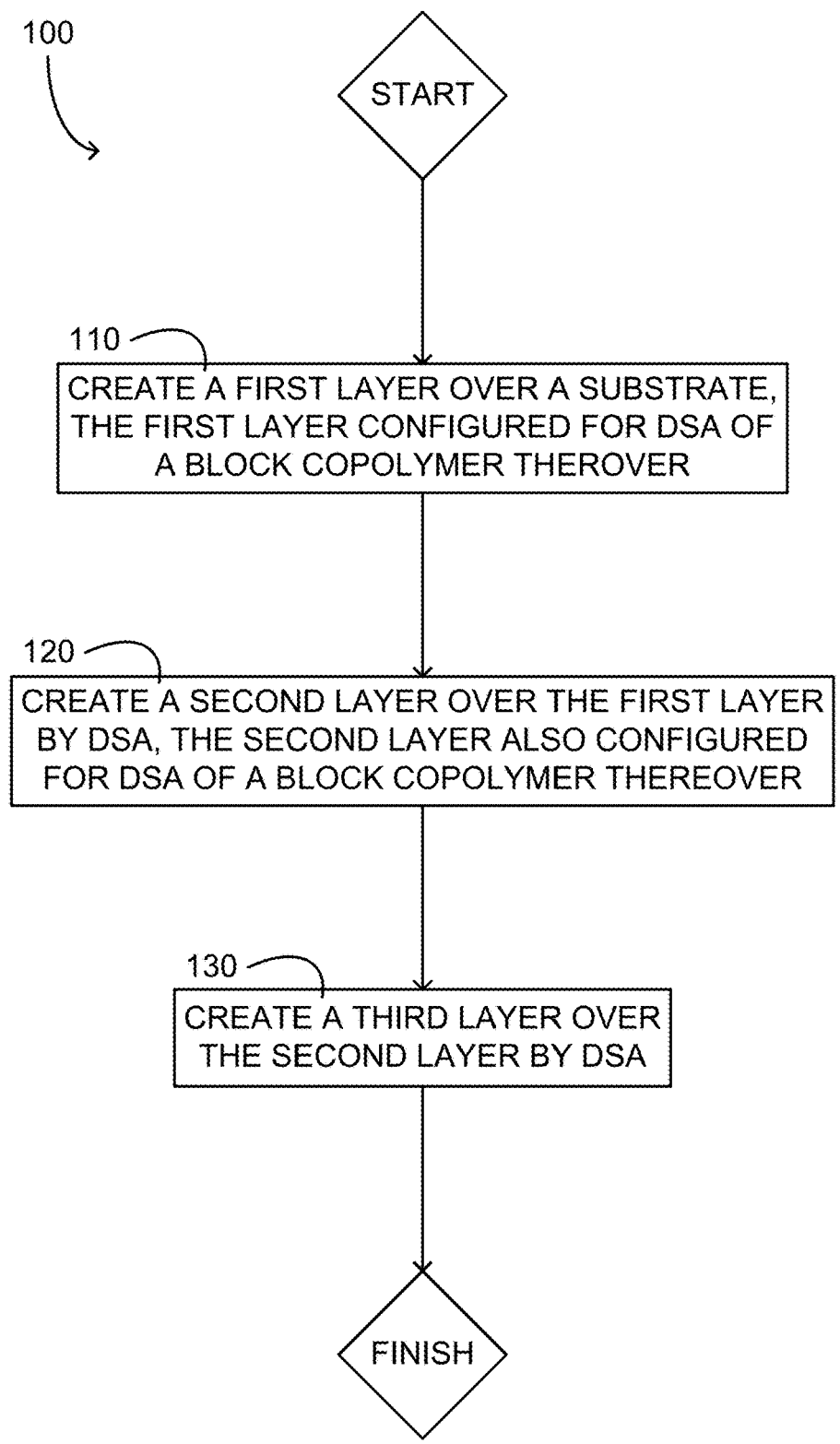

(51) Int. Cl.
*H01L 21/027* (2006.01)
*G03F 7/16* (2006.01)
*C08L 53/00* (2006.01)
*B81C 1/00* (2006.01)
*G03F 7/00* (2006.01)
*G03F 7/09* (2006.01)
*G03F 7/20* (2006.01)

(52) U.S. Cl.
CPC ............. *G03F 7/094* (2013.01); *G03F 7/165* (2013.01); *G03F 7/168* (2013.01); *G03F 7/40* (2013.01); *G03F 7/70* (2013.01); *H01L 21/0274* (2013.01); *B81C 2201/0149* (2013.01)

(58) Field of Classification Search
USPC .......................................................... 430/322
See application file for complete search history.

(56) References Cited

U.S. PATENT DOCUMENTS

| | | | | |
|---|---|---|---|---|
| 9,644,110 | B2* | 5/2017 | Seshimo | ............... C09D 153/00 |
| 9,835,947 | B2* | 12/2017 | Seino | .................. B81C 1/00031 |
| 2009/0196488 | A1 | 8/2009 | Nealey et al. | |
| 2013/0045361 | A1* | 2/2013 | Willson | ............... B81C 1/00031 |
| | | | | 428/141 |
| 2014/0193754 | A1 | 7/2014 | Wu et al. | |
| 2014/0193976 | A1 | 7/2014 | Kim et al. | |
| 2014/0273476 | A1 | 9/2014 | Cheng et al. | |
| 2014/0335324 | A1 | 11/2014 | Kim et al. | |
| 2014/0377518 | A1* | 12/2014 | Trefonas, III | ........... B32B 43/00 |
| | | | | 428/212 |
| 2015/0261090 | A1* | 9/2015 | Willson | ..................... G03F 7/20 |
| | | | | 430/325 |
| 2015/0322689 | A1* | 11/2015 | Niidome | ................. E04H 12/20 |
| | | | | 248/530 |
| 2015/0343395 | A1* | 12/2015 | Aamer | ............... B01D 67/0016 |
| | | | | 210/490 |
| 2016/0342089 | A1* | 11/2016 | Ruiz | ..................... G03F 7/0002 |
| 2017/0240681 | A1* | 8/2017 | Willson | .................. B05D 3/108 |

OTHER PUBLICATIONS

KR issued "Written Opinion of the International Searching Authority" dated Aug. 12, 2015, for International Application No. PCT/US2014/066228; 5 pages.

PCT International Preliminary Report on Patentability (Chapter I) dated Jun. 1, 2017 in International Application No. PCT/US14/66228. 7 pages.

\* cited by examiner

METHODS AND APPARATUSES FOR DIRECTED SELF-ASSEMBLY

CROSS-REFERENCE TO RELATED APPLICATION BACKGROUND

This application is a U.S. National Stage Application Under U.S.C. § 371 of International Patent Application Number PCT/US2014/066228, filed on Nov. 18, 2014, entitled "METHODS AND APPARATUSES FOR DIRECTED SELF-ASSEMBLY", which is incorporated herein in its entirety by reference.

BACKGROUND

Conventional directed self-assembly ("DSA") for pattern density multiplication utilizes an initial chemoepitaxial or graphoepitaxial guiding pattern created by a lithographic process (e.g., e-beam lithography), wherein the initial guiding pattern is limited to a resolution corresponding to about a 30-nm pitch. A conventional block copolymer used for DSA may have a natural pitch of about 5 nm or less; however, the initial guiding pattern created by the foregoing lithographic process limits realization of a correspondingly high resolution (e.g., a resolution corresponding to about a 5-nm pitch or less). Realization of such a high resolution (e.g., a resolution corresponding to about a 10-nm pitch or less) is important for increased pattern densities such as those desired for high-areal density, patterned recording devices (e.g., 1 Tdpsi or greater).

SUMMARY

Provided herein is a method, including creating a first layer over a substrate, wherein the first layer is configured for directed self-assembly of a block copolymer thereover; creating a continuous second layer over the first layer by directed self-assembly of a block copolymer, wherein the second layer is also configured for directed self-assembly of a block copolymer thereover; and creating a third layer over the continuous second layer by directed self-assembly of a block copolymer. Also provided is an apparatus, comprising a continuous first layer comprising a thin film of a first, microphase-separated block copolymer, wherein the first layer comprises a first chemoepitaxial template configured for directed self-assembly of a block copolymer thereon; and a second layer on the first layer, wherein the second layer comprises a thin film of a second, microphase-separated block copolymer.

These and other features and/or aspects of the concepts provided herein may be better understood with reference to the following drawings, description, and appended claims.

DRAWINGS

FIG. 1 provides a flow chart of a method for DSA in accordance with some embodiments.

Figure 2:
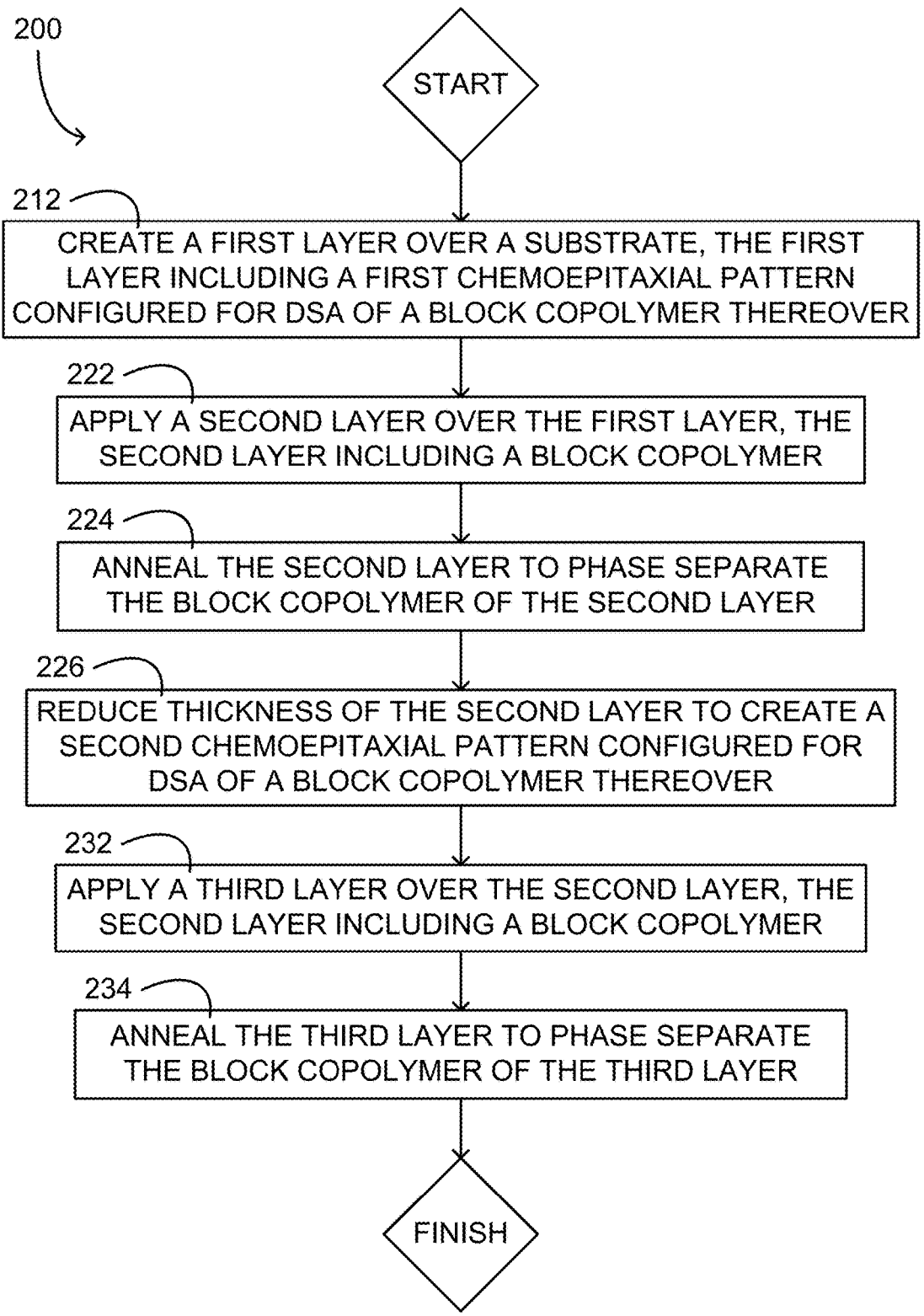

FIG. 2 provides a flow chart of a method for DSA in accordance with some embodiments.

Figure 3:
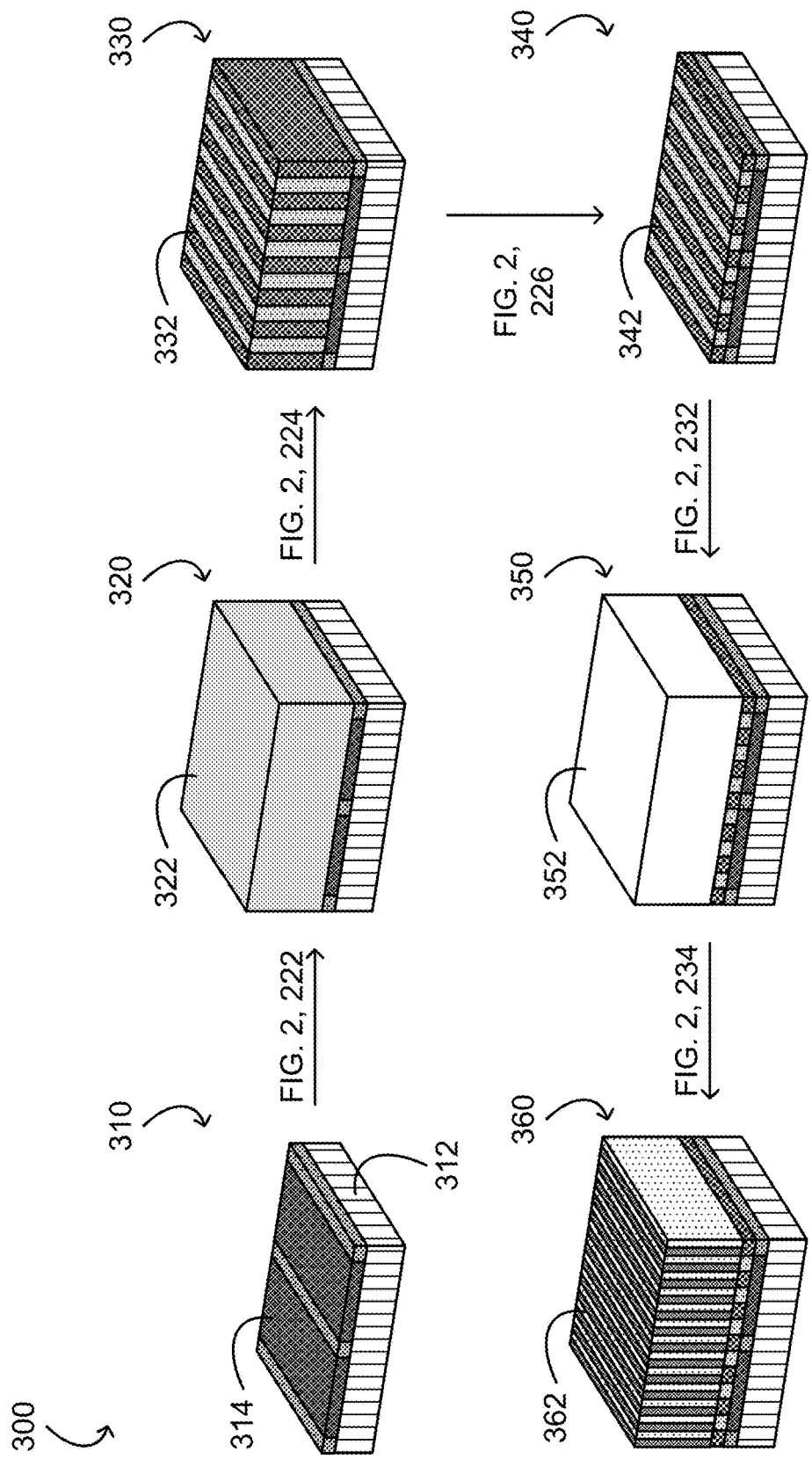

FIG. 3 provides a scheme for DSA in accordance with some embodiments.

Figure 4A:
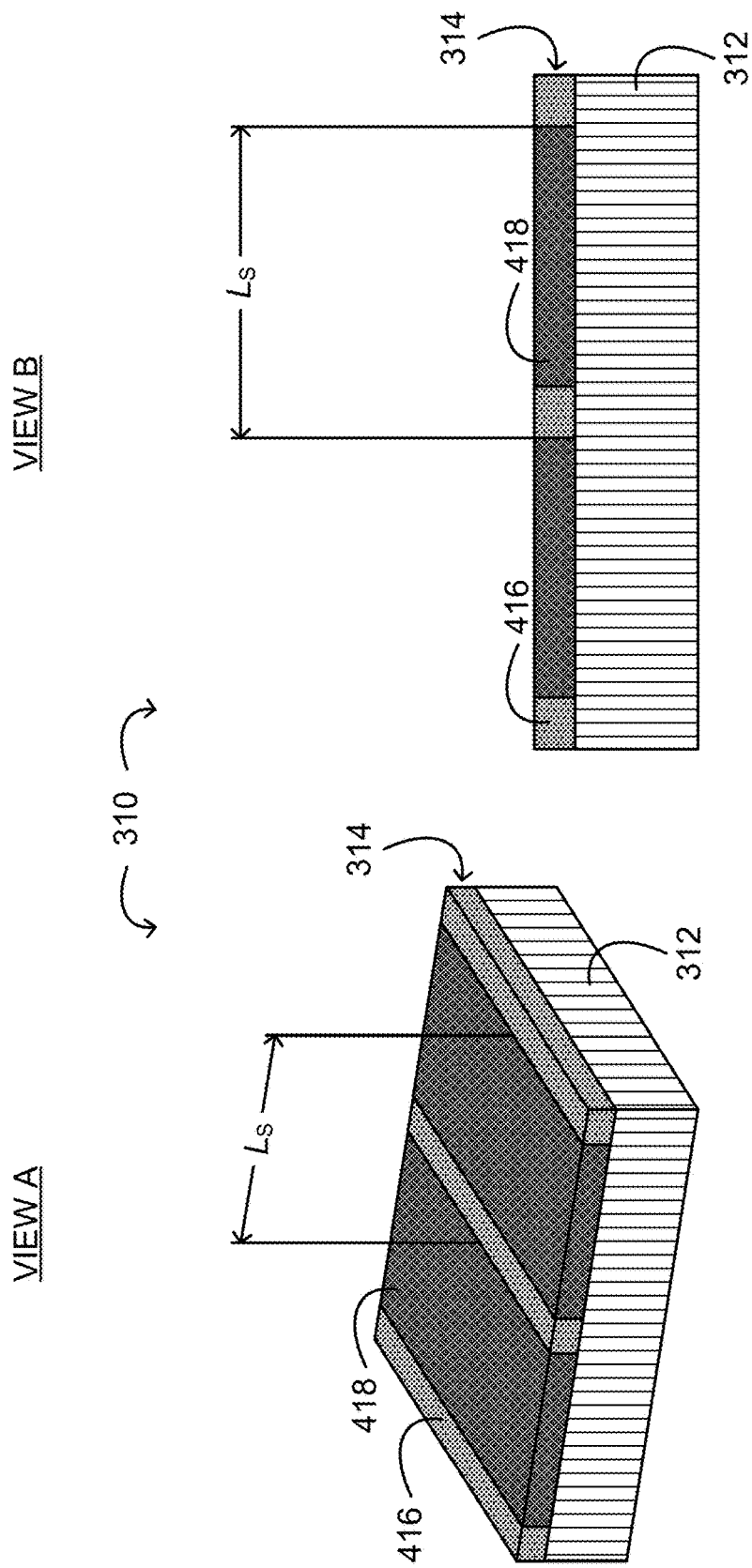

FIG. 4A provides an apparatus for DSA in accordance with some embodiments.

Figure 4B:
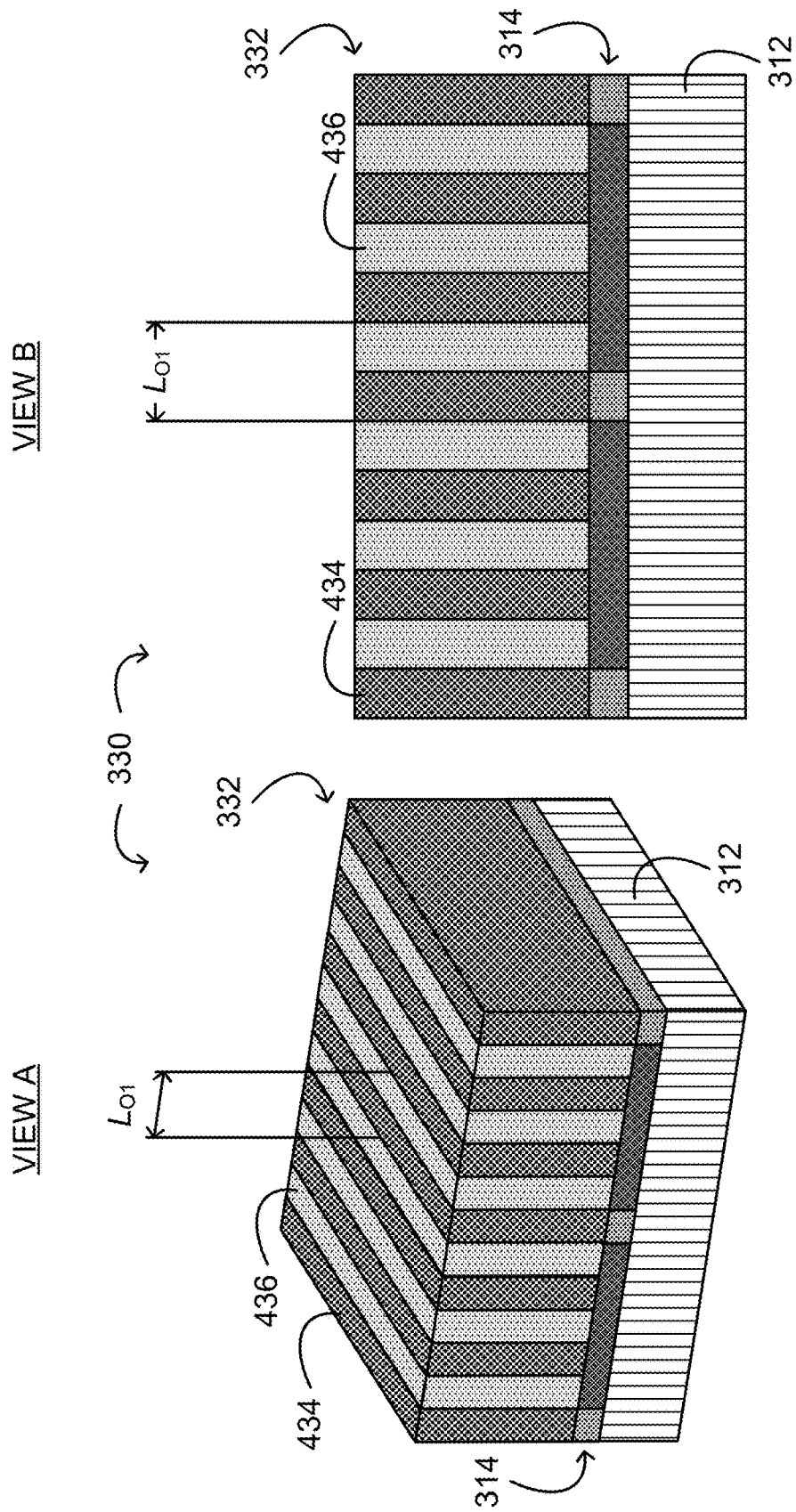

FIG. 4B provides an apparatus subsequent to annealing a block copolymer for DSA in accordance with some embodiments.

Figure 4C:
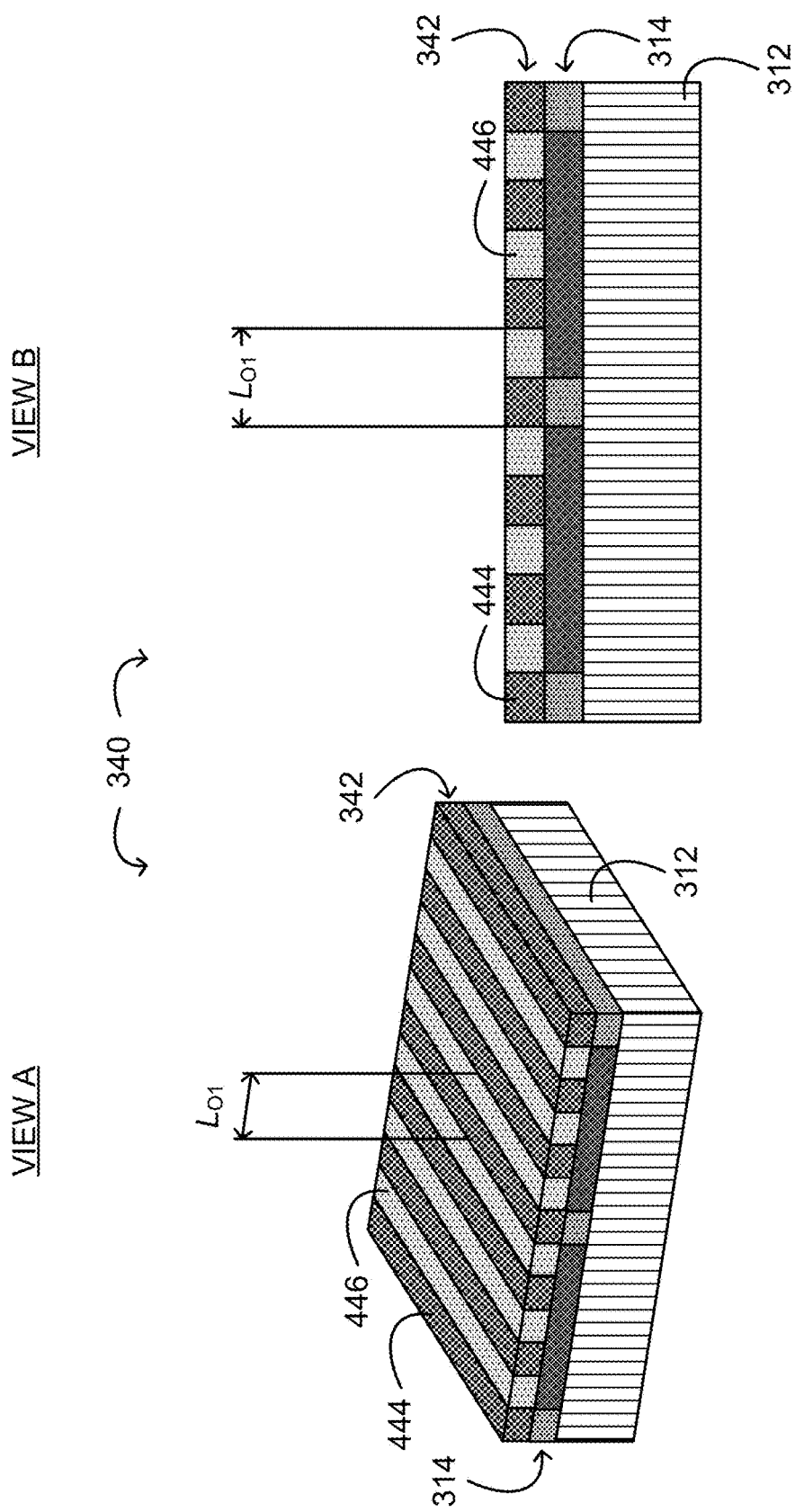

FIG. 4C provides an apparatus for DSA in accordance with some embodiments.

Figure 4D:
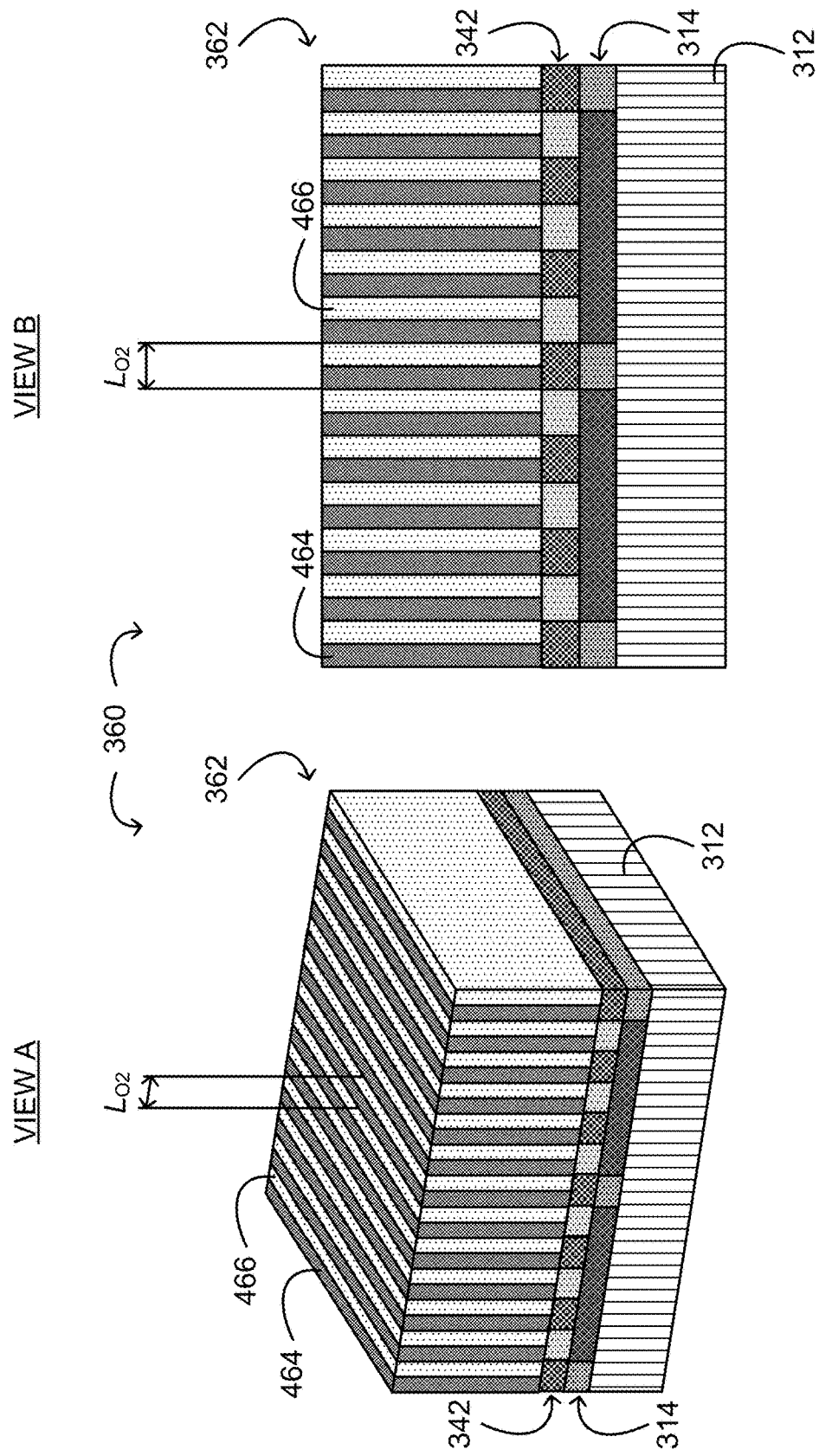

FIG. 4D provides an apparatus subsequent to annealing a block copolymer for DSA in accordance with some embodiments.

Figure 5:
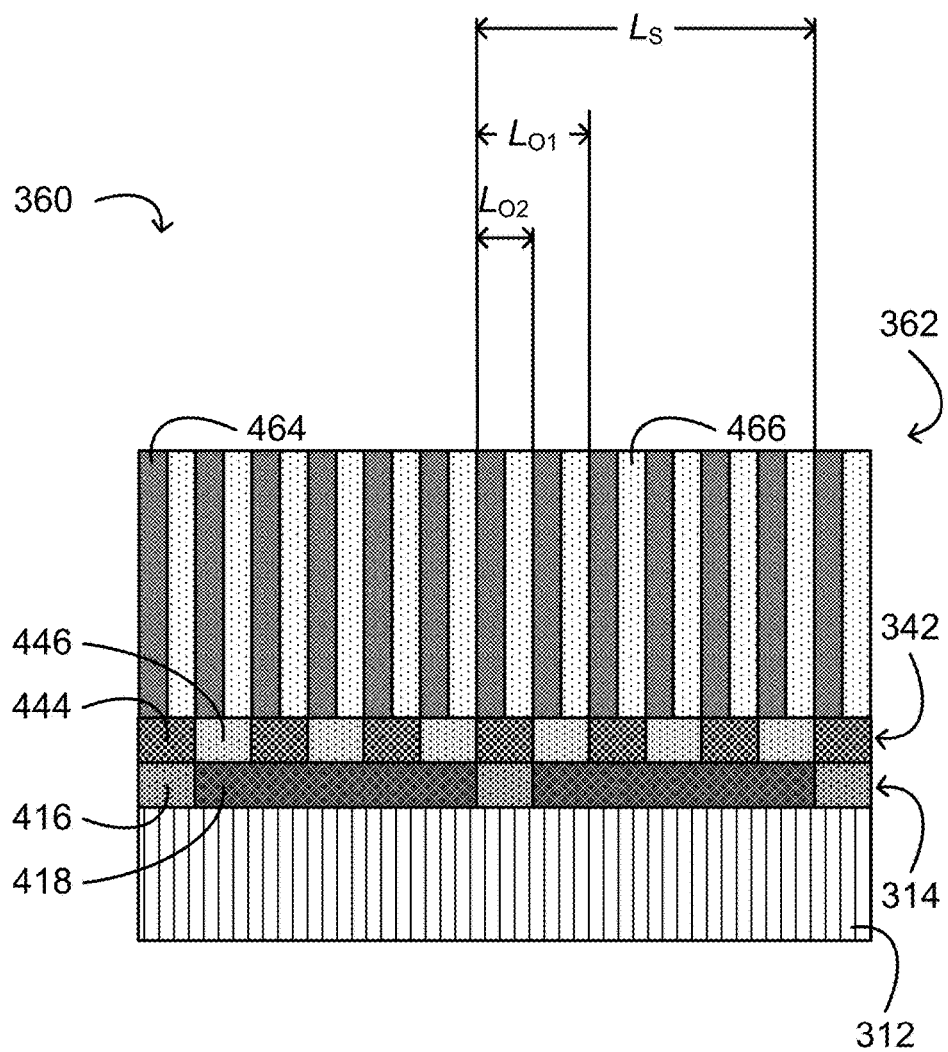

FIG. 5 provides an apparatus with DSA-related pitches $L_S$, $L_{O1}$, and $L_{O2}$ in accordance with some embodiments.

DESCRIPTION

Before some particular embodiments are illustrated and/or described in greater detail, it should be understood by persons having ordinary skill in the art that the particular embodiments do not limit the scope of the concepts provided herein, as features of such particular embodiments may vary. It should likewise be understood that a particular embodiment has features that may be readily separated from the particular embodiment and optionally combined with or substituted for features of any of a number of other embodiments illustrated and/or provided herein.

It should also be understood by persons having ordinary skill in the art that the terminology used herein is for the purpose of describing some particular embodiments, and the terminology does not limit the scope of the concepts provided herein. Unless indicated otherwise, ordinal numbers (e.g., first, second, third, etc.) are used to distinguish or identify different features or steps in a group of features or steps, and do not supply a serial or numerical limitation. For example, "first," "second," and "third" features or steps need not necessarily appear in that order, and the particular embodiments need not necessarily be limited to the three features or steps. It should also be understood that, unless indicated otherwise, any labels such as "left," "right," "front," "back," "top," "bottom," "forward," "reverse," "clockwise," "counter clockwise," "up," "down," or other similar terms such as "upper," "lower," "aft," "fore," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Unless defined otherwise, all technical and scientific terms used herein have the same meaning as commonly understood by persons of ordinary skill in the art.

Conventional DSA for pattern density multiplication utilizes an initial chemoepitaxial or graphoepitaxial guiding pattern created by a lithographic process (e.g., electron-beam lithography), wherein the initial guiding pattern is limited to a resolution corresponding to about a 30-nm pitch. A conventional block copolymer used for DSA may have a natural pitch of about 5 nm or less; however, the initial guiding pattern created by the foregoing lithographic process limits realization of a correspondingly high resolution (e.g., a resolution corresponding to about a 5-nm pitch or less). Realization of such a high resolution (e.g., a resolution corresponding to about a 10-nm pitch or less, such as about a 5-nm pitch or less) is important for increased pattern densities such as those desired for high-areal density, patterned recording devices (e.g., 1 Tdpsi or greater). Provided herein are methods and apparatuses for DSA for realization of high-resolution pattern densities.

FIG. 1 provides a flow chart of a method 100 for DSA in accordance with some embodiments. As shown in FIG. 1, the method 100 may commence with a step 110, which may include creating a first layer over a substrate, wherein the first layer may be configured for DSA of a block copolymer thereover. A lithographic process including e-beam lithography, imprint lithography, 193-nm lithography, or EUV lithography may be used to create the first layer. Following the step 110 is a step 120, which may include creating a second layer over the first layer by DSA, wherein the second layer may also be configured for DSA of a block copolymer thereover. Following the step 120 is a step 130, which may include creating a third layer over the second layer by DSA. As a result of density multiplication, the third layer may include a smaller feature pitch than that of the second layer resulting in a higher resolution for the third layer.

While not shown in FIG. 1, it should be understood that the third layer may also be configured for DSA of a block copolymer thereover, and a subsequent step may include creating a fourth layer over the third layer by DSA, wherein the fourth layer, in turn, may also be configured for DSA of a block copolymer thereover. Indeed, any of a number of subsequent layers may be created by DSA for DSA until a desired resolution is attained.

In accordance with the step 110 of FIG. 1, creating the first layer over the substrate may include creating a first layer configured for a graphoepitaxial DSA process, a chemoepitaxial DSA process, or some combination of the foregoing DSA processes. Likewise, creating the second layer over the first layer in accordance with the step 120 of FIG. 1 may include creating a second layer configured for a graphoepitaxial DSA process, a chemoepitaxial DSA process, or some combination of the foregoing DSA processes.

It should be understood that a graphoepitaxial DSA process is a DSA process including graphoepitaxy or physical patterns to direct self-assembly of block copolymers. It should also be understood that a chemoepitaxial DSA process is a DSA process including chemoepitaxy or chemical patterns to direct self-assembly of block copolymers.

While each of the first and second layers may be individually configured for a graphoepitaxial DSA process, a chemoepitaxial DSA process, or some combination of the foregoing DSA processes, the following description for FIG. 2 includes each of the first and second layers individually configured for a chemoepitaxial DSA process. However, it should be understood that FIG. 2 and the description therefor is in accordance with some embodiments of the concepts presented herein, and that FIG. 2 and the description therefor should not be construed as limiting.

FIG. 2 provides a flow chart of a method 200 for DSA in accordance with some embodiments. As shown in FIG. 2, the method may commence with a step 212, which may include creating a first layer over a substrate, wherein the first layer may include a first chemoepitaxial pattern configured for DSA of a block copolymer thereover. A lithographic process including e-beam lithography, imprint lithography, 193-nm lithography, or EUV lithography may be used to create the first layer. Following the step 212 is a step 222, which may include applying (e.g., spin-coating) a second layer over the first layer, wherein the second layer may include a block copolymer. Following the step 222 is a step 224, which may include annealing (e.g., thermal annealing, solvent annealing, or thermosolvent annealing) the second layer to separate the block copolymer of the second layer into microphases. Following the step 224 is a step 226, which may include reducing thickness (e.g., reducing thickness by plasma etching with a process gas such as oxygen or a fluorine-bearing gas) of the second layer to create a second chemoepitaxial pattern configured for DSA of a block copolymer thereover. Following the step 226 is a step 232, which may include applying (e.g., spin-coating) a third layer over the second layer, wherein the second layer may include a block copolymer. Following the step 232 is a step 234, which may include annealing (e.g., thermal annealing, solvent annealing, or thermosolvent annealing) the third layer to separate the block copolymer of the third layer into microphases. As a result of density multiplication, the third layer may include a smaller feature pitch than that of the second layer resulting in a higher resolution for the third layer.

While not shown in FIG. 2, it should be understood that the third layer may also be reduced in thickness to create a third chemoepitaxial pattern configured for DSA of a block copolymer thereover, and a subsequent step may include creating a fourth layer over the third layer by DSA, wherein the fourth layer, in turn, may also be reduced in thickness to create a fourth chemoepitaxial pattern configured for DSA of a block copolymer thereover. Indeed, any of a number of subsequent layers may be created by DSA for DSA until a desired resolution is attained.

FIG. 3 provides a scheme 300 for DSA in accordance with some embodiments. As shown in FIG. 3, the method may commence with an apparatus 310 including a substrate 312 and a first layer 314 over the substrate 312, wherein the first layer 314 may include a first chemoepitaxial pattern configured for DSA of a block copolymer thereover. The apparatus 310 may be provided in accordance with the step 212 of FIG. 2, and the first chemoepitaxial pattern may include a chemoepitaxial pattern configured for a block copolymer morphology selected from lamellae (as shown), spheres, cylinders, and a combination thereof. A second layer 322 may be subsequently applied in accordance with the step 222 of FIG. 2 to provide an apparatus 320 including the second layer 322 over the first layer 314, wherein the second layer 322 may include a block copolymer. The second layer 322 may be subsequently annealed in accordance with the step 224 of FIG. 2 to provide an apparatus 330 including an annealed second layer 332, wherein the annealed second layer 332 may include the block copolymer in a microphase-separated state. Depending upon the first chemoepitaxial pattern and/or the block copolymer of the annealed second layer 332, the microphase-separated state may include a block copolymer morphology selected from lamellae (as shown), spheres, cylinders, and a combination thereof. The annealed second layer 332 may be subsequently reduced in thickness in accordance with the step 226 of FIG. 2 to provide an apparatus 340 including a thickness-reduced, annealed second layer 342, wherein the thickness-reduced, annealed second layer 342 may include a second chemoepitaxial pattern configured for DSA of a block copolymer thereover. The second chemoepitaxial pattern may be similar to or different than the first chemoepitaxial pattern, and the second chemoepitaxial pattern may include a chemoepitaxial pattern configured for a block copolymer morphology selected from lamellae (as shown), spheres, cylinders, and a combination thereof. A third layer 352 may be subsequently applied in accordance with the step 232 of FIG. 2 to provide an apparatus 350 including the third layer 352 over the thickness-reduced, annealed second layer 342, wherein the third layer 352 may include a block copolymer. The third layer 352 may be subsequently annealed in accordance with the step 234 of FIG. 2 to provide an apparatus 360 including an annealed third layer 362, wherein the annealed third layer 362 may include the block copolymer in a microphase-separated state. Depending upon the second chemoepitaxial pattern and/or the block copolymer of the annealed third layer 362, the microphase-separated state may configured for a block copolymer morphology selected from lamellae (as shown), spheres, cylinders, and a combination thereof, wherein the block copolymer morphology of the annealed third layer 362 is similar to or different than the block copolymer morphology of the annealed second layer 332.

While not shown in FIG. 3, it should be understood that the annealed third layer 362 may also be subsequently reduced in thickness to provide an apparatus including a thickness-reduced, annealed third layer, wherein the thickness-reduced, annealed third layer may include a third chemoepitaxial pattern configured for DSA of a block copolymer thereover. A fourth layer may be subsequently applied, annealed, and reduced in thickness to provide an apparatus including a thickness-reduced, annealed fourth layer, wherein the thickness-reduced, annealed fourth layer may include a fourth chemoepitaxial pattern configured for DSA of a block copolymer thereover. Indeed, any of a number of subsequent layers may be created by DSA for DSA until a desired resolution is attained.

FIG. 4A provides an apparatus 310 for DSA in accordance with some embodiments. As shown in FIG. 4A, the apparatus 310 may include a substrate 312 (e.g., quartz) and a first layer 314 over the substrate 312, wherein the first layer 314 may include a first chemoepitaxial pattern configured for DSA of a block copolymer thereover. While the first chemoepitaxial pattern of FIG. 4A shows a chemoepitaxial pattern configured for lamellae, the first chemoepitaxial pattern may include a chemoepitaxial pattern configured for a block copolymer morphology selected from lamellae, spheres, cylinders, and a combination thereof as described herein. Regardless, the first chemoepitaxial pattern may include one or more pinning regions (e.g., one or more pinning stripes 416), with which a first, particular microphase of an applied block copolymer chemically prefers to interact. The first chemoepitaxial pattern may further include one or more neutral regions (e.g., one or more neutral stripes 418), with which a second, particular microphase of an applied block copolymer chemically prefers to interact, or with which no particular microphase of the applied block copolymer chemically prefers to interact. As further shown in FIG. 4A, a number of pinning regions (e.g., a number of pinning stripes 416) may be alternately arranged with a number of neutral regions (e.g., a number of neutral stripes 418). As even further shown in FIG. 4A, $L_s$ may represent the pitch of the first chemoepitaxial pattern, wherein $L_s$ may include the distance between corresponding points of adjacent pinning regions.

Turning back to FIG. 3, FIG. 3 provides an apparatus 320 subsequent to applying a block copolymer for DSA in accordance with some embodiments. As shown in FIG. 3, the apparatus 320 may include a second layer 322 over the first layer 314 and the substrate 312, wherein the second layer 322 may include a continuous, topographically flat layer of homogeneous or uniform composition. The uniform or homogeneous composition may include a block copolymer selected from a diblock copolymer, a triblock copolymer, a tetrablock copolymer, and the like. A diblock copolymer, for example, may include, but is not limited to, a diblock copolymer selected from polystyrene-b-poly(methylmethacrylate) ("PS-b-PMMA"), polystyrene-b-poly(dimethylsiloxane) ("PS-b-PDMS"), and polystyrene-b-poly(2-vinylpyridine) ("PS-b-P2VP").

FIG. 4B provides an apparatus 330 subsequent to annealing a block copolymer for DSA in accordance with some embodiments. As shown in FIG. 4B, the apparatus 330 may include an annealed second layer 332 over the first layer 314 and the substrate 312, wherein the annealed second layer 332 may include a continuous, topographically flat layer of heterogeneous or microphase-separated composition. While the microphase-separated state of FIG. 4B shows lamellae, the microphase-separated state may include a block copolymer morphology selected from lamellae, spheres, cylinders, and a combination thereof depending upon the first chemoepitaxial pattern and/or the block copolymer of the annealed second layer 332. Regardless, the annealed second layer 332 may include a first microphase 434 that chemically prefers to interact with the one or more pinning regions (e.g., the one or more pinning stripes 416) of the first chemoepitaxial pattern of the first layer 314. The annealed second layer 332 may further include a second microphase 436 that either chemically prefers to interact with the one or more neutral regions (e.g., the one or more neutral stripes 418) of the first chemoepitaxial pattern of the first layer 314 or chemically prefers to interact with none of the one or more pinning or neutral regions of the first chemoepitaxial pattern of the first layer 314. As further shown in FIG. 4B, the first microphase 434 may be alternately arranged with the second microphase 436 to form a pattern in the annealed second layer 332. As even further shown in FIG. 4B, $L_{O1}$ may represent the pitch of the pattern in the annealed second layer 332, wherein $L_{O1}$ may include the distance between corresponding points of adjacent features of the first microphase 434. $L_{O1}$ may also represent the natural pitch of the applied and subsequently annealed block copolymer.

FIG. 4C provides an apparatus 340 for DSA in accordance with some embodiments. As shown in FIG. 4C, the apparatus 340 may include a thickness-reduced, annealed second layer 342 over the first layer 314 and the substrate 312, wherein the thickness-reduced, annealed second layer 342 may include a continuous, topographically flat layer of heterogeneous or microphase-separated composition. The thickness-reduced, annealed second layer 342 may include a thickness-reduced, first microphase 444 and a thickness-reduced, second microphase 446. The thickness-reduced, annealed second layer 342 may further include a second chemoepitaxial pattern configured for DSA of a block copolymer thereover. While the second chemoepitaxial pattern of FIG. 4C shows a chemoepitaxial pattern configured for lamellae, the second chemoepitaxial pattern may include a chemoepitaxial pattern configured for a block copolymer morphology selected from lamellae, spheres, cylinders, and a combination thereof as described herein. Regardless, the second chemoepitaxial pattern may include one or more pinning regions (e.g., one or more pinning stripes) formed of the thickness-reduced, first microphase 444, with which a first, particular microphase of an applied block copolymer chemically prefers to interact. The second chemoepitaxial pattern may further include one or more neutral regions (e.g., one or more neutral stripes) formed of the thickness-reduced, second microphase 446, with which a second, particular microphase of an applied block copolymer chemically prefers to interact, or with which no particular microphase of the applied block copolymer chemically prefers to interact. As further shown in FIG. 4C, the pinning regions formed of the thickness-reduced, first microphase 444 may be alternately arranged with the neutral regions formed of the thickness-reduced, second microphase 446. As even further shown in FIG. 4C, $L_{O1}$ may represent the pitch of the second chemoepitaxial pattern, wherein $L_{O1}$ may include the distance between corresponding points of adjacent pinning regions.

Turning back to FIG. 3, FIG. 3 provides an apparatus 350 subsequent to applying a block copolymer for DSA in accordance with some embodiments. As shown in FIG. 3, the apparatus 350 may include a third layer 352 over the thickness-reduced, annealed second layer 342, the first layer 314, and the substrate 312, wherein the third layer 352 may include a continuous, topographically flat layer of homogeneous or uniform composition. The uniform or homogeneous composition may include a block copolymer selected from a diblock copolymer, a triblock copolymer, a tetrablock copolymer, and the like. A diblock copolymer, for example, may include, but is not limited to, a diblock copolymer selected from polystyrene-b-poly(methylmethacrylate) ("PS-b-PMMA"), polystyrene-b-poly (dimethylsiloxane) ("PS-b-PDMS"), and polystyrene-b-poly(2-vinylpyridine) ("PS-b-P2VP"). The block copolymer of the third layer 352 may be the same as or different than the block copolymer of the second layer 322.

FIG. 4D provides an apparatus 360 subsequent to annealing a block copolymer for DSA in accordance with some embodiments. As shown in FIG. 4D, the apparatus 360 may include an annealed third layer 362 over the thickness-reduced, annealed second layer 342, the first layer 314, and the substrate 312, wherein the annealed third layer 362 may include a continuous, topographically flat layer of heterogeneous or microphase-separated composition. While the microphase-separated state of FIG. 4D shows lamellae, the microphase-separated state may include a block copolymer morphology selected from lamellae, spheres, cylinders, and a combination thereof depending upon the second chemoepitaxial pattern and/or the block copolymer of the annealed third layer 362. Regardless, the annealed third layer 362 may include a first microphase 464 that chemically prefers to interact with the one or more pinning regions (e.g., the one or more pinning stripes) of the second chemoepitaxial pattern of the second layer 342. The annealed third layer 362 may further include a second microphase 466 that either chemically prefers to interact with the one or more neutral regions (e.g., the one or more neutral stripes) of the second chemoepitaxial pattern of the second layer 342 or chemically prefers to interact with none of the one or more pinning or neutral regions of the second chemoepitaxial pattern of the second layer 342. As further shown in FIG. 4D, the first microphase 464 may be alternately arranged with the second microphase 466 to form a pattern in the annealed third layer 362. As even further shown in FIG. 4D, $L_{O2}$ may represent the pitch of the pattern in the annealed third layer 362, wherein $L_{O2}$ may include the distance between corresponding points of adjacent features of the first microphase 464. $L_{O2}$ may also represent the natural pitch of the applied and subsequently annealed block copolymer.

FIG. 5 provides an apparatus with DSA-related pitches $L_S$, $L_{O1}$, and $L_{O2}$ in accordance with some embodiments. As described in reference to FIG. 4A, $L_s$ may represent the pitch of the first chemoepitaxial pattern, wherein $L_s$ may include the distance between corresponding points of adjacent pinning regions (e.g., adjacent pinning stripes 416). As described in reference FIG. 4B, $L_{O1}$ may represent the pitch of the second chemoepitaxial pattern, wherein $L_{O1}$ may include the distance between corresponding points of adjacent pinning regions (e.g., adjacent pinning stripes formed of the thickness-reduced, first microphase 444). $L_{O1}$ may also represent the natural pitch of the corresponding block copolymer. As described in reference to FIG. 4D, $L_{O2}$ may represent the pitch of the pattern in the annealed third layer 362, wherein $L_{O2}$ may include the distance between corresponding points of adjacent features of the first microphase 464. In an apparatus including a thickness-reduced, annealed third layer including a third chemoepitaxial pattern configured for DSA of a block copolymer thereover, $L_{O2}$ may represent the pitch of the third chemoepitaxial pattern, wherein $L_{O2}$ may include the distance between corresponding points of adjacent pinning regions (e.g., adjacent pinning stripes formed of the thickness-reduced, first microphase 464). $L_{O2}$ may also represent the natural pitch of the corresponding block copolymer.

As shown in FIG. 5, $L_S$ may be, but is not limited to, a multiple of $L_{O1}$, which, in turn, may be, but is not limited to, a multiple of $L_{O2}$. In some embodiments, for example, $L_S$ may be a multiple of $L_{O1}$, wherein the coefficient $n_1$ may be greater than or equal to at least 2:

$L_S = n_1 \cdot L_{O1}$, wherein $n_1 \geq 2$

In such embodiments, for example, $L_S$ may be greater than or equal to at least $2L_{O1}$, $3L_{O1}$, $4L_{O1}$, $5L_{O1}$, $6L_{O1}$, or more. In some embodiments, for example, $L_{O1}$ may be a multiple of $L_{O2}$, wherein the coefficient $n_2$ may be greater than or equal to at least 2:

$L_{O1} = n_2 \cdot L_{O2}$, wherein $n_2 \geq 2$

In such embodiments, for example, $L_{O1}$ may be greater than or equal to at least $2L_{O2}$, $3L_{O2}$, $4L_{O2}$, $5L_{O2}$, $6L_{O2}$, or more. It should be understood that mathematical relationships derived from the foregoing may also be used to describe the DSA-related pitches $L_S$, $L_{O1}$, and $L_{O2}$.

As further shown in FIG. 5, $L_{O2}$ may be, but is not limited to, a divisor of $L_{O1}$, which, in turn, may be, but is not limited to, a divisor of $L_S$. In some embodiments, for example, $L_{O2}$ may be a divisor of $L_{O1}$, wherein the coefficient $n_2$ may be greater than or equal to at least 2:

$L_{O1}/L_{O2} = n_2$, wherein $n_2 \geq 2$

In such embodiments, for example, $n_2$ may be greater than or equal to at least 2, 3, 4, 5, 6, or more. In view of the foregoing, $n_2$ may represent the amount of density multiplication from the second layer (e.g., the thickness-reduced, annealed second layer 342 of FIG. 3) to the third layer (e.g., the annealed third layer 362). In some embodiments, for example, $L_{O1}$ may be a divisor of $L_S$, wherein the coefficient $n_1$ may be greater than or equal to at least 2:

$L_S/L_{O1} = n_1$, wherein $n_1 \geq 2$

In such embodiments, for example, $n_1$ may be greater than or equal to at least 2, 3, 4, 5, 6, or more. In view of the foregoing, $n_1$ may represent the amount of density multiplication from the first layer (e.g., the first layer 314 of FIG. 3) to the second layer (e.g., the annealed second layer 332). Further in view of the foregoing, $n_1 \cdot n_2$ may represent the total amount of density multiplication from the first layer (e.g., the first layer 314 of FIG. 3) to the third layer (e.g., the annealed third layer 362). It should be understood that additional mathematical relationships derived from the foregoing may also be used to describe the DSA-related pitches $L_S$, $L_{O1}$, and $L_{O2}$.

As such, provided herein is a method, comprising creating a first layer over a substrate, wherein the first layer is configured for directed self-assembly of a block copolymer thereover; creating a continuous second layer over the first layer by directed self-assembly of a block copolymer, wherein the second layer is also configured for directed self-assembly of a block copolymer thereover; and creating a third layer over the continuous second layer by directed self-assembly of a block copolymer. In some embodiments, creating the first layer comprises lithographically creating the first layer by e-beam lithography, imprint lithography, 193-nm lithography, or EUV lithography. In some embodiments, creating the second layer comprises spin-coating a thin film of a first block copolymer over the first layer, thermally annealing the thin film of the first block copolymer, and reducing the thickness of the thin film of the first block copolymer. In some embodiments, creating the third layer comprises spin-coating a thin film of a second block copolymer over the second layer and thermally annealing the thin film of the second block copolymer. In some embodiments, the first layer comprises a chemoepitaxial template configured for directed self-assembly of a block copolymer thereover. In some embodiments, the chemoepitaxial template comprises features with a pitch $L_S$, wherein $L_S$ is about 30 nm. In some embodiments, the second layer comprises a phase-separated block copolymer comprising features with a pitch $L_{O1}$, wherein $L_{O1}=L_S/n_1$, and wherein $n_1 \geq 2$. In some embodiments, the third layer comprises a phase-separated block copolymer comprising features with a pitch $L_{O2}$, wherein $L_{O2}=L_{O1}/n_2$, and wherein $n_2 \geq 2$.

Also provided herein is an apparatus, comprising a first layer over a substrate, wherein the first layer is configured for directed self-assembly of a block copolymer thereover; a continuous second layer over the first layer, wherein the second layer comprises a thin film of a first, phase-separated block copolymer, and wherein the second layer is also configured for directed self-assembly of a block copolymer thereover; and a third layer over the second layer, wherein the second layer comprises a thin film of a second, phase-separated block copolymer. In some embodiments, the first layer comprises a chemoepitaxial template configured for directed self-assembly of a block copolymer thereover, wherein the chemoepitaxial template comprises features with a pitch $L_S$. In some embodiments, the second layer comprises features with a pitch $L_{O1}$, wherein $L_{O1}=L_S/n_1$, and wherein $n_1 \geq 2$. In some embodiments, the third layer comprises features with a pitch $L_{O2}$, wherein $L_{O2}=L_{O1}/n_2$, and wherein $n_2 \geq 2$. In some embodiments, each of the first and second block copolymers comprises a diblock copolymer individually selected from PS-b-PMMA, PS-b-PDMS, and PS-b-P2VP. In some embodiments, each of the first and second block copolymers comprises a sphere, a cylinder, or a lamella morphology.

Also provided herein is an apparatus, comprising a continuous first layer comprising a thin film of a first, phase-separated block copolymer, wherein the first layer comprises a first chemoepitaxial template configured for directed self-assembly of a block copolymer thereon; and a second layer on the first layer, wherein the second layer comprises a thin film of a second, phase-separated block copolymer. In some embodiments, the first layer comprises features of a first pitch $L_{O1}$, the second layer comprises features of a second pitch $L_{O2}$, and $L_{O1} > L_{O2}$. In some embodiments, $L_{O1}=n_2 \cdot L_{O2}$, wherein $n_2 \geq 2$. In some embodiments, the apparatus further comprises a second chemoepitaxial template also configured for directed self-assembly of a block copolymer thereon, wherein the first layer is on the second chemoepitaxial template. In some embodiments, the second chemoepitaxial template comprises features with a pitch $L_S$, wherein $L_S=n_1 \cdot L_{O1}$, and wherein $n_1 \geq 2$. In some embodiments, each of the first and second block copolymers comprises a diblock copolymer individually selected from PS-b-PMMA, PS-b-PDMS, and PS-b-P2VP.

While some particular embodiments have been illustrated and/or described herein, and while the particular embodiments have been illustrated and/or described in some detail, it is not the intention of the applicant(s) for the particular embodiments to limit the scope of the concepts presented herein. Additional adaptations and/or modifications may readily appear to persons having ordinary skill in the art, and, in broader aspects, these adaptations and/or modifications may be encompassed as well. Accordingly, departures may be made from the particular embodiments illustrated and/or described herein without departing from the scope of the concepts provided herein. The implementations provided herein and other implementations are within the scope of the following claims.

What is claimed is:

1. A method, comprising:
   creating a first layer over a substrate,
      wherein the first layer is configured for directed self-assembly of a block copolymer thereover;
   creating a continuous second layer over the first layer by directed self-assembly of a block copolymer,
      wherein the second layer is also configured for directed self-assembly of a block copolymer thereover; and
   creating a third layer over the continuous second layer by directed self-assembly of a block copolymer.

2. The method of claim 1, wherein creating the first layer comprises lithographically creating the first layer by e-beam lithography, imprint lithography, 193-nm lithography, or EUV lithography.

3. The method of claim 2, wherein creating the second layer comprises spin-coating a thin film of a first block copolymer over the first layer, thermally annealing the thin film of the first block copolymer, and reducing the thickness of the thin film of the first block copolymer.

4. The method of claim 3, wherein creating the third layer comprises spin-coating a thin film of a second block copolymer over the second layer and thermally annealing the thin film of the second block copolymer.

5. The method of claim 1, wherein the first layer comprises a chemoepitaxial template configured for directed self-assembly of a block copolymer thereover.

6. The method of claim 5, wherein the chemoepitaxial template comprises features with a pitch $L_S$, and wherein $L_S$ is about 30 nm.

7. The method of claim 6, wherein the second layer comprises a phase-separated block copolymer comprising features with a pitch $L_{O1}$, wherein $L_{O1}=L_S/n_1$, and wherein $n_1 \geq 2$.

8. The method of claim 7, wherein the third layer comprises a phase-separated block copolymer comprising features with a pitch $L_{O2}$, wherein $L_{O2}=L_{O1}/n_2$, and wherein $n_2 \geq 2$.

9. An apparatus, comprising:
   a first layer over a substrate, wherein
      the first layer is configured for directed self-assembly of a block copolymer thereover, and
      the first layer comprises a chemoepitaxial template configured for directed self-assembly of a block copolymer thereover, and wherein the chemoepitaxial template comprises features with a pitch $L_S$;
   a continuous second layer over the first layer, wherein
      the second layer comprises a thin film of a first, phase-separated block copolymer,
      the second layer is also configured for directed self-assembly of a block copolymer thereover, and
      the second layer comprises features with a pitch $L_{O1}$, wherein $L_{O1}=L_S/n_1$, and wherein $n_1 \geq 2$; and
   a third layer over the second layer, wherein
      the second layer comprises a thin film of a second, phase-separated block copolymer, and
      the third layer comprises features with a pitch $L_{O2}$, wherein $L_{O2}=L_{O1}/n_2$, and wherein $n_2 \geq 2$.

10. The apparatus of claim 9, wherein each of the first and second block copolymers comprises a diblock copolymer individually selected from PS-b-PMMA, PS-b-PDMS, and PS-b-P2VP.

11. The apparatus of claim 9, wherein each of the first and second block copolymers comprises a sphere, a cylinder, or a lamella morphology.

12. An apparatus, comprising:
a continuous first layer comprising a thin film of a first, phase-separated block copolymer,
wherein the first layer comprises a first chemoepitaxial template configured for directed self-assembly of a block copolymer thereon; and
a second layer on the first layer,
wherein the second layer comprises a thin film of a second, phase-separated block copolymer, and
a second chemoepitaxial template also configured for directed self-assembly of a block copolymer thereon,
wherein the first layer is on the second chemoepitaxial template.

13. The apparatus of claim 12, wherein the first layer comprises features of a first pitch $L_{O1}$, wherein the second layer comprises features of a second pitch $L_{O2}$, and wherein $L_{O1} > L_{O2}$.

14. The apparatus of claim 13, wherein $L_{O1} = n_2 \cdot L_{O2}$, and wherein $n_2 \geq 2$.

15. The apparatus of claim 14, wherein the second chemoepitaxial template comprises features with a pitch $L_S$, wherein $L_S = n_1 \cdot L_{O1}$, and wherein $n_1 \geq 2$.

16. The apparatus of claim 12, wherein each of the first and second block copolymers comprises a diblock copolymer individually selected from PS-b-PMMA, PS-b-PDMS, and PS-b-P2VP.

* * * * *